United States Patent [19]

Fukaya

[11] 3,952,213

[45] Apr. 20, 1976

[54] DELAYED PULSE GENERATING CIRCUIT

[75] Inventor: Hirokazu Fukaya, Tokyo, Japan

[73] Assignee: Nippon Electric Company Limited, Tokyo, Japan

[22] Filed: Aug. 27, 1974

[21] Appl. No.: 500,849

[30] Foreign Application Priority Data
Aug. 28, 1973  Japan.............................. 48-95686

[52] U.S. Cl............................. 307/265; 307/235 N; 307/290; 307/293; 328/55
[51] Int. Cl.².................... H03K 3/295; H03K 17/28
[58] Field of Search ........... 328/116, 117, 112, 114, 328/150, 132, 55; 307/265, 266, 290, 235 E, 235 N, 235 T, 235 R, 293

[56] References Cited
UNITED STATES PATENTS

| | | | |
|---|---|---|---|
| 2,946,010 | 7/1960 | Tarczy-Hornoch | 328/116 |
| 3,192,408 | 6/1965 | Cho | 328/117 |
| 3,543,159 | 11/1970 | Slayden et al. | 307/235 N |
| 3,639,779 | 2/1972 | Garrigus | 307/235 N |
| 3,806,915 | 4/1974 | Higgins et al. | 307/235 N |

*Primary Examiner*—John S. Heyman
*Attorney, Agent, or Firm*—Hopgood, Calimafde, Kalil, Blaustein and Lieberman

[57] ABSTRACT

Delayed pulses are produced by a circuit in which an initiating input pulse causes signals to be supplied to two threshold circuits. The outputs of the threshold circuits are supplied to a gate circuit having an output determined by the difference in time of occurrence of the trailing edges of the output pulses generated by the threshold circuits.

14 Claims, 7 Drawing Figures

DELAYED PULSE GENERATING CIRCUIT

BACKGROUND OF THE INVENTION

The present invention relates to delayed pulse generating circuits capable of generating a pulse delayed by a predetermined time interval following the application of an initiating input pulse, and more particularly to delayed pulse generating circuits suited for fabrication as integrated circuits, simple in construction, and capable of generating pulses having the desired width and waveform.

A typical known delayed pulse generating circuit is formed by a first pulse generating circuit driven by an input trigger pulse to generate a pulse dependent upon a first time-constant circuit provided in the first pulse generating circuit, and a second pulse generating circuit driven by a pulse of differential waveform corresponding to the trailing edge of the output pulse of the first pulse generating circuit. A pulse is thus generated having a pulse width dependent upon a second time-constant circuit provided in the second pulse generating circuit. This type of delayed pulse generating circuit, when fabricated into an integrated circuit must be equipped with a number of additional terminals for capacitors included in the time delay circuit and the differentiation circuit. This requirement is not readily compatible with the structure of packages limited in the number of terminals. Furthermore, the prior art circuit requires considerable numbers of capacitors which necessitate extra area on an IC substrate.

Therefore, it is an object of the present invention to provide a delayed pulse generating circuit, simple in construction with a minimum number of capacitors, and suited for adaptation to an IC configuration.

SUMMARY OF THE INVENTION

With this and other objectives in view, the invention includes pulse input circuit means for generating an output in response to predetermined conditions. This output, which may for example be a saw-tooth wave or a sine wave, is supplied to first and second threshold circuits means arranged in parallel and responsive to the pulse input circuit. The first threshold circuit means generates an output pulse, the beginning and end of which are respectively determined by preselected high and low threshold levels. The second threshold circuit means generates an output pulse the end of which is determined by a threshold value. A gate circuit means is responsive to the outputs generated by the first and second threshold circuit means for producing a delayed pulse having a width determined by the difference in the time of occurrance of the ends of said generated outputs.

In one embodiment, the second threshold circuit means has both high and low threshold levels, one of which may be substantially equal to the corresponding threshold level of the first threshold circuit means. In another embodiment, the second threshold circuit has only a single independent threshold level which lies between the levels of the first threshold circuit.

BRIEF DESCRIPTION OF THE DRAWINGS

An understanding of additional aspects of the invention can be gained from a consideration of the following detailed description of a representative embodiment of the invention taken in conjunction with the appended drawings wherein.

DESCRIPTION OF THE PREFERRED EMBODIMENTS

Figure 1:
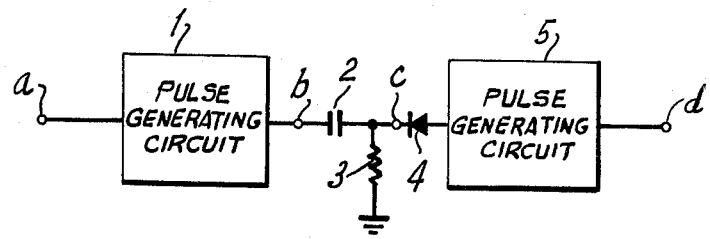
FIG. 1 is a circuit diagram showing a prior art delayed pulse generating circuit.
Figure 2:
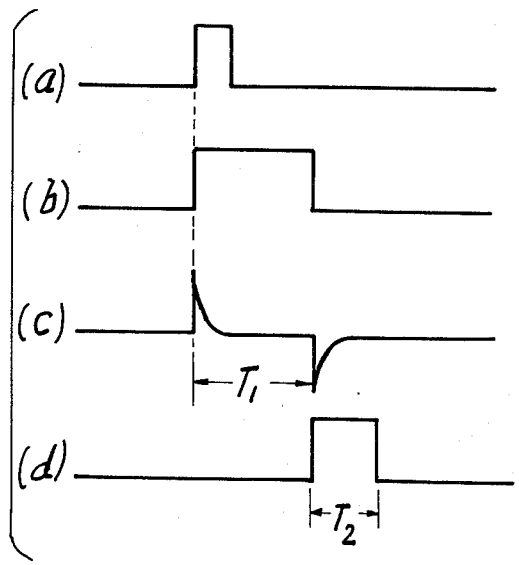
FIG. 2 is a diagram showing waveforms appearing in the circuit of FIG. 1.

In FIG. 1 a typical prior art delayed pulse generating circuit is shown in block form wherein a differentiation circuit including a capacitor 2 and a resistor 3 is connected between two pulse generating circuits 1 and 5. A diode 4 causes the pulse generating circuit 5 to be driven by a negative trigger pulse. The operation of this delayed pulse generating circuit will be described with reference to FIG. 2. When an input trigger pulse (a) is applied to the pulse generating circuit 1 (e.g., a monostable multivibrator), a pulse (b) is generated. This pulse (b) is differentiated by the capacitor 2 and resistor 3 into a negative pulse (c), which is used to trigger the pulse generating circuit 5 (e.g., a monostable multivibrator). The resultant output pulse is (d), which is delayed by a time interval T1 following the input trigger pulse and has a pulse width T2. The two time intervals T1 and T2 are determined by time-constant circuits included in the pulse generating circuits 1 and 5, respectively. This prior art delayed pulse generating circuit is equipped with terminals connected to capacitors to be used in the circuits 1 and 5 and to the differential capacitor 2. The necessity for these terminals has made it difficult to construct the delayed pulse generating circuit as an integrated circuit. In addition, the capacitors used in the prior act circuits have required extra space on an IC substrate. An object of the invention is to overcome the prior art drawbacks.

Figure 3:
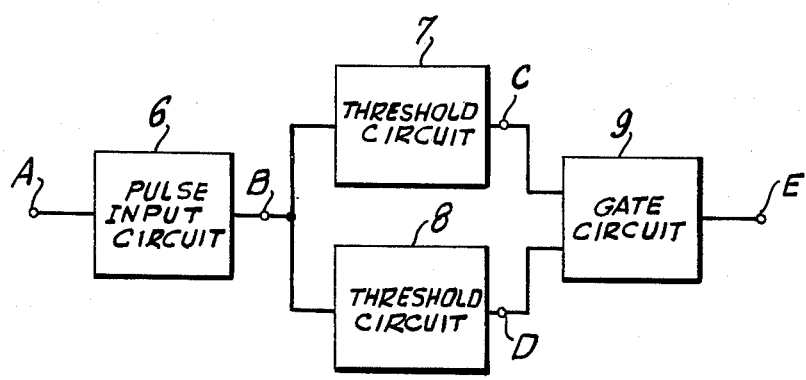
FIG. 3 is a circuit diagram showing a delayed pulse generating circuit arranged in accordance with the present invention.

Referring to FIG. 3, there is shown in block form an exemplary delayed pulse generating circuit of this invention, which comprises a pulse input circuit means 6, a first threshold circuit means 7 (e.g., a Schmitt circuit or a circuit having two comparators in parallel), a second threshold circuit means 8 (e.g., a Schmitt circuit or a circuit having two comparators in parallel), and a gate circuit means 9. The first threshold circuit 7 has high and low preselected threshold levels and is capable of generating a pulse having a width dependent upon those threshold levels. This first threshold circuit 7 is connected to the output side of the pulse input circuit 6. The second threshold circuit 8 has two threshold levels, a high and a low. One of these threshold levels is equal to the corresponding threshold level of the circuit 7, while the remaining threshold level is not equal to the corresponding level of the circuit 7. The second threshold circuit 8 is capable of generating a pulse with a leading edge occuring substantially simultaneously with the leading edge of the output pulse of the first threshold circuit 7. The pulse generated by the second threshold circuit 8 has a width unequal to that of the output pulse generated by the first threshold circuit 7. The second threshold circuit 8 is also connected to the output side of the pulse input circuit 6. The outputs of the first and second threshold circuits are supplied to the gate circuit 9, which in turn generates a delayed output pulse having a pulse width equal to the difference between the two pulses generated by the first and second threshold circuits 7 and 8. The output of the gate circuit 9 has a delay equivalent to the width of the output pulse of the second threshold circuit 8.

Figure 4:
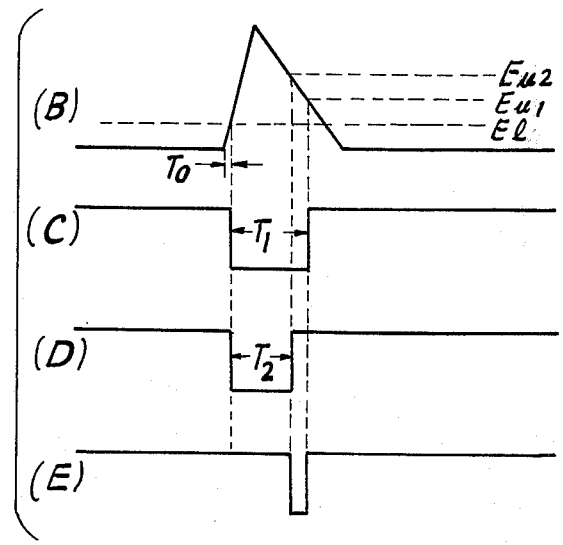
FIG. 4 is a diagram showing various waveforms appearing in the circuit of FIG. 3.

Assume that a pulse arrives at the input terminal A of the pulse input circuit 6, and a saw-tooth pulse is generated at the output terminal B by a saw-tooth waveform generating means within the circuit 6. This saw-tooth pulse is applied to the first and second threshold circuits 7 and 8 having threshold value levels as described above. Assume also the threshold values of the two threshold circuits are determined as shown by line (B) in FIG. 4, wherein $Eu_1$ is the high level threshold value of the circuit 7, $Eu_2$ is the high level threshold value of the circuit 8, and $El$ the common low level threshold value common to the circuits 7 and 8. Then, output pulses (C) and (D) in FIG. 4 with pulse widths corresponding to the individual threshold values are obtained at output terminals C and D. These output pulses are coincident at their leading edges and occur at a time reflecting a delay $T_0$ taken for the saw-tooth pulse (B) to reach the low threshold value $El$ from its rise point. However, the two output pulses differ from each other with respect to their widths. In FIG. 4, $T_1$ and $T_2$ are the pulse widths of outputs (C) and (D) from the threshold circuits 7 and 8, respectively. These output pulses are supplied to the gate circuit 9, which in turn generates a pulse (E) with a pulse width equal to the difference $(T_1-T_2)$ of the two pulse widths, and with a delay equal to $T_2$, the shorter of the two pulse widths. Therefore, the pulse generated at the output terminal of the gate circuit 9 is delayed by time $(T_0+T_2)$ after the input saw-tooth pulse has started rising. The time width $T_0$ can be made zero by using a differentiation circuit or equivalent with the pulse input circuit 6. The resultant delayed output pulse assumes an ideal waveform (E) shown in FIG. 4.

Although the invention is described here with reference to a saw-tooth circuit included in the pulse input circuit 6, other waveforms, such as a sine wave, could be generated instead and used in a similar manner.

As described above, the low threshold values of the two threshold circuits are considered equal to each other at a level $El$. In practical circuits, these levels are substantially or nominally equal but the low level $El$ of the threshold circuit 7 is likely to be slightly lower than that of the threshold circuit 8 due to variations in characteristics of the two individual threshold circuits. In this case, a small unwanted deviation will result between the leading edges of the pulses (C) and (D). This results in the occurrence of an unnecessary pulse from the gate circuit 9 having a pulse width equal to the deviation. The effect can be precluded, for example, by setting the nominal low level threshold value of the threshold circuit 7 higher than that of the threshold circuit 8 by a value corresponding to the characteristic variation. However, the difference in low level thresholds may be dealt with in the actual circuit; it is only important that for purposes of this description they be treated as substantially or functionally equal.

Figure 5:
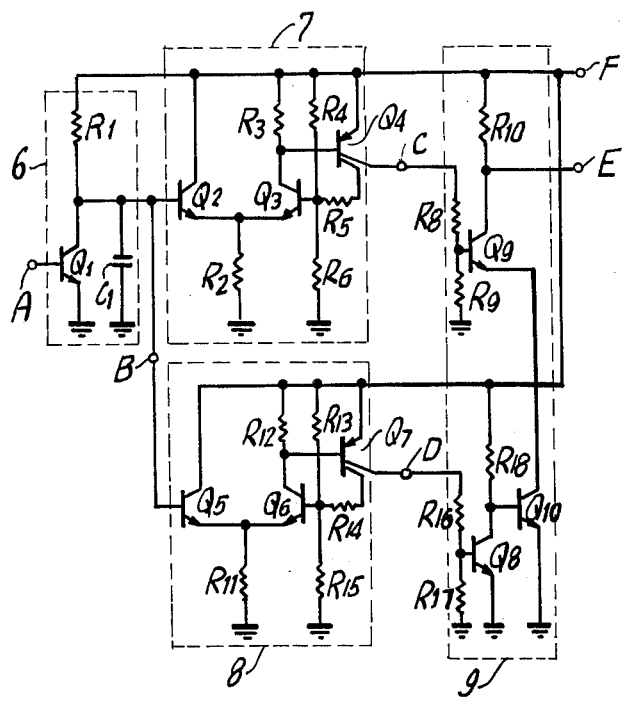
FIG. 5 is a circuit diagram showing a specific example of the circuit of the invention in greater detail.
Figure 6:
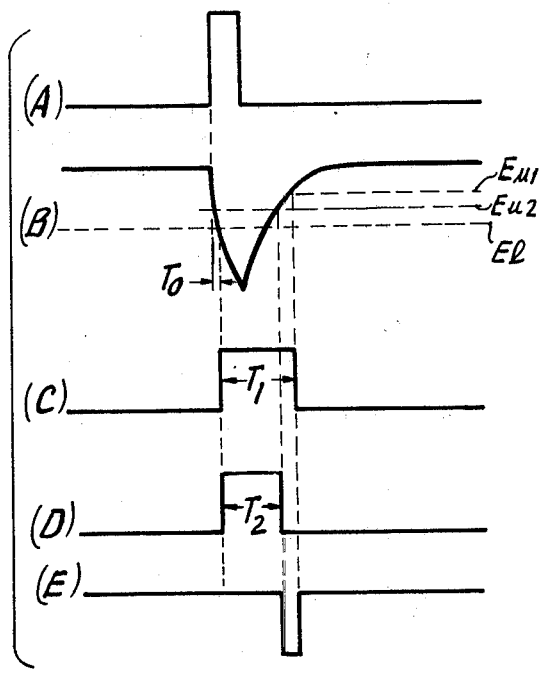
FIG. 6 is a diagram showing waveforms appearing in the circuit of FIG. 5.

Another embodiment of the invention is shown in FIG. 5 wherein Schmitt circuits are used instead of the threshold circuits of FIG. 3. Like components are identified by identical references in FIGS. 3 and 5. FIG. 6 shows waveforms of pulses appearing in the circuit shown in FIG. 5. In FIG. 5, the numeral 6 denotes a pulse input circuit consisting essentially of a time constant circuit having a resistor R1, a capacitor C1, and a transistor Q1. Also included are Schmitt circuits 7 and 8, and a gate circuit 9. When a pulse (A) (FIG. 6) is applied to the input terminal A of the pulse input circuit 6, the transistor Q1 operates to short-circuit the capacitor C1 of the time-constant circuit for the duration of the pulse applied, and the capacitor C1 releases its charge to ground. After the pulse duration, the transistor Q1 is turned off, the capacitor C1 is charged through a resistor R1 by a power source connected to power terminal F, and a pulse with a voltage waveform (B) appears at an input terminal B common to the first and second Schmitt circuits 7 and 8. This voltage is applied both to the Schmitt circuit 7 comprising transistors Q2, Q3, Q4, and resistors R2, R3, R4, R5, and R6, and to the Schmitt circuit 8 comprising transistors Q5, Q6, Q7 and resistors R11, R12, R13, R14 and R15. As a result, two pulses (C) and (D) shown in FIG. 6, with pulse widths corresponding to the individual threshold values are generated at the respective output terminals C and D across the resistors R8 and R9 and across the resistors R16 and R17, respectively. The two Schmitt circuits are so designed that the resistance ratio of R4 to R6 is equal to that of R13 to R15, the low level threshold values of the two circuits 7 and 8 are both $El$, the resistance value of R5 differs from that of R14, and the high level threshold value $Eu_1$ of the Schmitt from the high level threshold value of $Eu_2$ of the Schmitt circuit 8. The two Schmitt circuits generate output pulses (C) and (D) respectively (as shown in FIG. 6), having their leading edges substantially coincident with each other with a delay $T_0$ which the input pulse (A) in FIG. 3 takes to reach the low level threshold value $El$. The output pulses (C) and (D) have pulse widths $T_1$ and $T_2$, respectively, which are different from each other.

The two output pulses appearing respectively across the resistors R8 and R9 and across the resistors R16 and R17, that is, the outputs C and D of the two Schmitt circuits 7 and 8, are applied to the gate circuit 9, which in turn generates a pulse (E) having a pulse width $(T_1-T_2)$ equal to the difference between the pulse widths of the two output pulses, and having a delay $(T_0+T_2)$ following the input pulse (A) in FIG. 6. As shown in FIG. 5, the gate circuit comprises an NAND gate including transistors Q9 and Q10, and an inverter circuit including a transistor Q8. The pulse output produced at the output terminal D is amplified and inverted by the transistor Q8 to cause the transistor Q10 of the NAND gate to be turned off for the duration of the pulse, i.e., for the period $T_2$. The pulse output developed at the output terminal C causes the other transistor Q9 of the NAND gate to be turned on for the duration of the pulse, i.e., for the period $T_1$. The resultant output at the collector terminal E of transistor Q9 is a pulse having a pulse width $(T_1-T_2)$ which is the difference between the pulse widths of the two pulses applied to the gate circuit 9, and having a delay $(T_0+T_2)$ behind the input pulse. In FIG. 5, a power source is connected to the terminal F. The pulse width and delay of the output pulse can be arbitrarily predetermined by selecting the threshold values of the two Schmitt circuits 7 and 8 in terms of $T_0$, $T_{T1}$ and $T_2$.

In this embodiment, as in the previous one, a spurious output pulse is likely to occur due to variations in characteristics of the two threshold circuits. This can be avoided, for example, by determining the low level threshold value of the Schmitt circuit 7 to be slightly higher than that of the Schmitt circuit 8. Another approach to this problem is the use of a means (e.g., a transistor) for grounding the terminal E in FIG. 5 for the period for which the input pulse is applied as in FIG. 6. Such means should be connected between the terminal E and ground. In this arrangement, the pulse width of the input pulse should be narrower than the width ($T_0 + _{T1}$) in FIG. 6.

In the above example, a circuit including an inverter is used as the gate circuit 9, although the invention is not limited to this specific arrangement. For instance, other types of logical gate circuits may be used according to the input pulse applied to the threshold circuits 7 and 8. Also, the threshold circuit is not necessarily a Schmitt circuit, but any circuit having two threshold values may be used instead.

Figure 7:
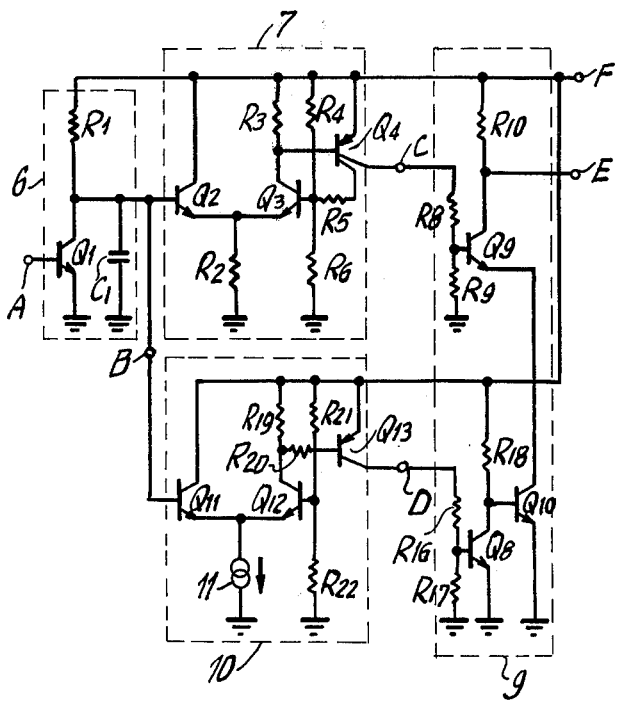
FIG. 7 is a circuit diagram showing another example of a circuit arranged according to the present invention.

In the foregoing embodiments, delay pulse generating circuits of the type using two threshold circuits 7 and 8 each having two threshold values have been illustrated. Instead, as shown in FIG. 7, a threshold circuit 10 having one threshold value, and a threshold circuit 7 having two threshold values may be used. In this example, the threshold circuit 10 is a comparator comprising transistors Q11, Q12, Q13, resistors R19, R20, R21, R22, and a constant current circuit 11. Assumed that the high and low threshold values of the threshold circuit 7 are determined as E$l$ and E$u_1$ respectively, as shown in FIG. 6, and also that one threshold value of the threshold circuit 10 is determined as E$u_2$ as in FIG. 6 by the resistance ratio R21 to R22. Then, the same delayed pulse as in FIG. 6(E) is obtained at the output terminal E in FIG. 7. Instead of the comparator, a Schmitt circuit having one threshold value may be used.

As described above, the delayed pulse generating circuit of the invention is simple in construction, includes a minimum number of capacitors and hence is well suited for adaptation to integrated circuit construction. Furthermore, the invention enables its delayed pulse generating circuit to generate a high-quality pulse with the desired delay and pulse width.

While a few preferred embodiments of the invention and particular modifications thereof have been described it is to be understood that this description is for the purpose of illustrating the invention and should not be construed as limiting the scope of the claims. Numerous modifications and variations within the scope of the invention may occur to persons skilled in the art.

I claim:

1. A delayed pulse generating circuit comprising: a pulse input circuit receiving an input pulse to be delayed and generating in response to said input pulse, an output having leading and trailing ramped edges, said output having a duration longer than that of said input pulse;

a first threshold circuit responsive to said output of said pulse input circuit for generatng a first output pulse the beginning and the end of which are determined by said leading and trailing edges of said output respectively corresponding to first and second threshold levels, said first and second threshold levels being different from one another, and the polarity of said first output being inverse to that of said output of said pulse input circuit;

a second threshold circuit responsive to said output of said pulse input circuit and arranged in parallel with said first threshold circuit for generating a second output pulse the beginning of which is not later than that of said first output pulse and the end of which is substantially earlier than that of said first output pulse, the polarity of said second output pulse being inverse to that of said output of said pulse input circuit; and a gate circuit receiving and comparing said first and second output pulses and producing a pulse having a duration corresponding to the duration from the end of said second output pulse to that of said first output pulse, said pulse of said gate circuit being derived from said gate circuit as an output-delayed pulse of said delayed pulse generating circuit.

2. The delayed pulse generating circuit of claim 1, wherein the pulse input circuit includes a saw-tooth wave generating circuit.

3. The delayed pulse generating circuit of claim 1, wherein the pulse input circuit includes a sine-wave generating circuit.

4. The delayed pulse generating circuit of claim 1, wherein each of the first and second threshold circuits comprises a Schmitt circuit.

5. The delayed pulse generating circuit of claim 1, wherein the first threshold circuit includes a circuit having two comparators in parallel.

6. The delayed pulse generating circuit of claim 1, wherein the second threshold circuit includes a comparator.

7. The delayed pulse generating circuit of claim 1, wherein said gate circuit comprises a first transistor having a grounded emitter, a second transistor having an emitter connected with the collector of said first transistor, a load connected between a power line and the collector of said second transistor, an inverter circuit the output of which is applied to the base of one of said first and second transistors, and an output terminal coupled with the collector of said second transistor, said first output pulse being applied to the base of the other of said first and second transistors, and said second output pulse being applied to the input terminal of said inverter circuit.

8. The delayed pulse generating circuit of claim 7, wherein said first and second transistors and said load construct a NAND gate.

9. A delayed pulse generating circuit comprising:

a pulse input circuit receiving an input pulse to be delayed and generating in response to said input pulse an output having leading and trailing ramped edges, said output having a duration longer than that of said input pulse;

a first threshold circuit responsive to said output of said pulse input circuit for generating a first output pulse the beginning and the end of which are determined by said ramped edges of said output respectively corresponding to first and second threshold levels, said first and second threshold levels being different from one another and the polarity of said first output being inverse to that of said output of said pulse input circuit;

a second threshold circuit responsive to said output of said pulse input circuit and arranged in parallel with said first threshold circuit for generating a second output pulse, the beginning of which is determined by the leading edge of said output corresponding to a third threshold level and being not later than that of said first output pulse and the end of said second output pulse being determined by the trailing edge of said output corresponding to a fourth threshold level and being substantially earlier than that of said first output pulse, the polarity of said second output pulse being inverse to that of said output of said pulse input circuit; and a gate circuit receiving and comparing said first and second output pulses and producing a pulse having a duration corresponding to the duration from the end of said second output pulse to that of said first output pulse, said pulse of said gate circuit being derived from said gate circuit as an output-delayed pulse of said delayed pulse generating circuit.

10. The delayed pulse generating circuit of claim 9, wherein the pulse input circuit includes a saw-tooth wave generating circuit.

11. The delayed pulse generating circuit of claim 9, wherein the pulse input circuit includes a sine-wave generating circuit.

12. The delayed pulse generating circuit of claim 9, wherein each of the first and second threshold circuits comprises a Schmitt circuit.

13. The delayed pulse generating circuit of claim 9, wherein each of the first and second threshold circuits includes two comparators in parallel.

14. The delayed pulse generating circuit of claim 9, wherein one of the threshold levels of the first threshold circuit means is substantially equal to the corresponding threshold level of the second circuit means.

* * * * *

UNITED STATES PATENT OFFICE
CERTIFICATE OF CORRECTION

Patent No. 3,952,213     Dated April 20, 1976

Inventor(s)  Hirokazu Fukaya

It is certified that error appears in the above-identified patent and that said Letters Patent are hereby corrected as shown below:

Page 1, name of Assignee incorrectly printed. It should read Nippon Electric Company, Ltd. rather than Nippon Electric Company Limited.

Signed and Sealed this

*twenty-ninth* Day of *June 1976*

[SEAL]

*Attest:*

RUTH C. MASON
*Attesting Officer*

C. MARSHALL DANN
*Commissioner of Patents and Trademarks*